United States Patent
Paek et al.

(10) Patent No.: US 9,859,847 B2
(45) Date of Patent: Jan. 2, 2018

(54) PARALLEL COMBINED OUTPUT LINEAR AMPLIFIER AND OPERATING METHOD THEREOF

(71) Applicant: Samsung Electronics Co., Ltd., Gyeonggi-do (KR)

(72) Inventors: Ji-Seon Paek, Gyeonggi-do (KR); Seung-Chul Lee, Gyeonggi-do (KR); Young-Hwan Choo, Seoul (KR); Sung-Jun Lee, Gyeonggi-do (KR); Jun-Hee Jung, Gyeonggi-do (KR); Thomas Byunghak Cho, Gyeonggi-do (KR); Jeong-Hyun Choi, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/843,580

(22) Filed: Sep. 2, 2015

(65) Prior Publication Data
US 2016/0065142 A1  Mar. 3, 2016

Related U.S. Application Data

(60) Provisional application No. 62/044,721, filed on Sep. 2, 2014.

(30) Foreign Application Priority Data

Apr. 22, 2015 (KR) .................. 10-2015-0056316

(51) Int. Cl.
*H03F 3/04* (2006.01)
*H03F 1/02* (2006.01)
*H03F 1/22* (2006.01)
*H03F 3/193* (2006.01)
(Continued)

(52) U.S. Cl.
CPC .......... *H03F 1/0227* (2013.01); *H03F 1/223* (2013.01); *H03F 3/193* (2013.01); *H03F 3/245* (2013.01); *H03F 3/3064* (2013.01); *H03F 2200/408* (2013.01); *H03F 2200/432* (2013.01);
(Continued)

(58) Field of Classification Search
CPC .................................................. H03F 1/0205
USPC .... 330/295, 124 R, 310, 311, 277, 253, 262, 330/263, 264
See application file for complete search history.

(56) References Cited

U.S. PATENT DOCUMENTS

| | | | |
|---|---|---|---|
| 8,536,939 B2* | 9/2013 | Shibata | H03F 3/45183 330/124 R |
| 2010/0045247 A1 | 2/2010 | Blanken et al. | |
| 2014/0062590 A1 | 3/2014 | Khlat et al. | |

* cited by examiner

*Primary Examiner* — Khanh V Nguyen
*Assistant Examiner* — Khiem Nguyen
(74) *Attorney, Agent, or Firm* — The Farrell Law Firm, P.C.

(57) ABSTRACT

A parallel output linear amplifier is provided that includes a transconductance amplifier configured to receive an analog input signal from an input terminal and amplify the analog input signal. The parallel output linear amplifier also includes a first pre-amplifier connected to the transconductance amplifier and operated using a floating drive voltage, and a cascode class AB amplifier connected to the first pre-amplifier and configured to provide an amplified signal to an output terminal. The parallel output linear amplifier further includes a second pre-amplifier configured connected to the transconductance amplifier and operated using the floating drive voltage, and a cascode class AB amplifier connected to the second pre-amplifier and configured to provide an amplified signal to the output terminal.

23 Claims, 8 Drawing Sheets

(51) Int. Cl.
    *H03F 3/24*       (2006.01)
    *H03F 3/30*       (2006.01)
(52) U.S. Cl.
    CPC ................. *H03F 2200/451* (2013.01); *H03F 2203/30015* (2013.01)

PARALLEL COMBINED OUTPUT LINEAR AMPLIFIER AND OPERATING METHOD THEREOF

PRIORITY

This application claims priority under 35 U.S.C. §119(a) to a Korean Patent Application filed in the Korean Intellectual Property Office on Apr. 22, 2015 and assigned Serial No. 10-2015-0056316, and under 35 U.S.C. §119(e) to a U.S. Provisional Patent Application filed in the U.S. Patent and Trademark Office on Sep. 2, 2014 and assigned Ser. No. 62/044,721, the contents of which are incorporated herein by reference.

BACKGROUND

1. Field of the Disclosure

The present disclosure relates generally to a parallel combined output linear amplifier and operating method thereof, and more particularly, to a parallel combined output linear amplifier having a wide load drive range and a wide dynamic range and operating method thereof.

2. Description of the Related Art

In a wireless communication system, a power amplifier (PA) is used for amplifying a signal before the signal is transmitted through an antenna. Typical characteristics of a PA include a gain and power efficiency.

The gain of the PA is a performance criterion that increases an output signal from an input signal. It is important for a PA to maintain constant performance while an input value or a frequency changes.

The power efficiency of a PA relates to supply power by which the PA is operated. Specially, for a small electronic device with a limited battery capacity, it is very important to effectively manage the supply power of the PA.

A typical PA, which is used at a radio frequency (RF) terminal of a terminal for a wireless mobile communication, uses a battery of the terminal as supply power. As a peak to average power ratio (PAPR) of an input signal increases, the efficiency of an RF PA decreases. An input signal with a high PAPR requires a 1 dB gain compression point (P1 dB) and saturated power for an RF PA. Thus, a typical RF PA, which is operated by fixed supply power, has low power efficiency at both of a peak power range and a back-off power range.

In an attempt to prevent low power efficiency at the back-off power range, technology has been developed that adjusts a supply power of an RF PA while tracking an average power of an input signal. Specially, an envelope tracking (ET) technology improves a power efficiency characteristic of the RF PA by adjusting the supply power of the RF PA while tracking an envelope signal of an input signal. A key device of an ET PA is a supply modulator (SM) for regulating battery power into an envelope signal. The SM has a hybrid structure that includes a linear regulator and a switching regulator for satisfying high bandwidth and high efficiency. An analog output amplifier, which is used in a linear regulator for ET power amplification, requires specifications for efficiency, speed, bandwidth, dynamic range, a linear characteristic, load drive capacity, and the like.

In an analog output amplifier, which is used in a wireless mobile communication terminal, a design criterion such as, for example, efficiency, speed, bandwidth, dynamic range, a linear characteristic, load drive capacity, and the like, requires a high target value. However, in a complementary metal-oxide-semiconductor (CMOS) process, which is generally used as a process of an analog circuit, a parasitic capacitance exists that is proportional to a size of a circuit. A parasitic capacitance for a large MOS field-effect transistor (MOSFET), which is used for driving a large current, slows an operating speed of the circuit. Additionally, the CMOS process results in a limited output voltage and load drive capability for a device that is used in the circuit. Further, a wide load drive capability is required to drive a load such as a multi-mode/multi-band (MMMB) RF PA, which has been proposed to minimize a size of a chip to one circuit.

It is difficult for a process and a circuit structure of an analog output amplifier to satisfy all characteristics and requirements, resulting in a trade-off of some extent. Efficiency of a linear amplifier, which uses a fixed supply voltage, decreases at a back-off power range.

SUMMARY

An aspect of the present disclosure provides a circuit structure of an analog output amplifier for driving an RF PA with high efficiency, high speed, high linear characteristic, and wide load range.

In accordance with an aspect of the present disclosure, a parallel output linear amplifier is provided that includes a transconductance amplifier configured to receive an analog input signal from an input terminal and amplify the analog input signal. The parallel output linear amplifier also includes a first pre-amplifier connected to the transconductance amplifier and operated using a floating drive voltage, and a cascode class AB amplifier connected to the first pre-amplifier and configured to provide an amplified signal to an output terminal. The parallel output linear amplifier further includes a second pre-amplifier configured connected to the transconductance amplifier and operated using the floating drive voltage, and a cascade class AB amplifier connected to the second pre-amplifier and configured to provide an amplified signal to the output terminal.

In accordance with another aspect of the present disclosure, an operating method of a parallel output linear amplifier is provided. A transconductance amplifier receives an analog input signal from an input terminal. The transconductance amplifier amplifies the analog input signal to generate a first amplified signal. A first pre-amplifier generates a second amplified signal by amplifying the first amplified signal based on floating drive voltage. A cascode class AB amplifier provides the second amplified signal to an output terminal. A second pre-amplifier generates a third amplified signal by amplifying the first amplified signal based on the floating drive voltage. A cascade class AB amplifier provides the third amplified signal to the output terminal.

In accordance with another aspect of the present disclosure, a parallel output linear amplifier is provided that includes a first amplifier configured to receive an analog signal from an input terminal, amplify an analog input signal, and generate a first amplified signal. The parallel output linear amplifier also includes a second amplifier configured to receive the first amplified signal from the first amplifier, amplify the first amplified signal, and generate a second amplified signal. The parallel output linear amplifier also includes a third amplifier configured to receive the first amplified signal from the first amplifier, amplify the first amplified signal, and generate a third amplified signal. The parallel output linear amplifier also includes a fourth amplifier configured to receive the second amplified signal from the second amplifier, and provide the second amplified signal to an output terminal, the fourth amplifier being a cascode class AB amplifier. The parallel output linear amplifier also includes a fifth amplifier configured to receive the third amplified signal from the third amplifier, and provide the third amplified signal to the output terminal, the fifth amplifier being a cascade class AB amplifier.

BRIEF DESCRIPTION OF THE DRAWINGS

The above and other aspects, features, and advantages of embodiments of the present disclosure will be more apparent from the following detailed description when taken in conjunction with the accompanying drawings, in which.

DETAILED DESCRIPTION

Figure 1:
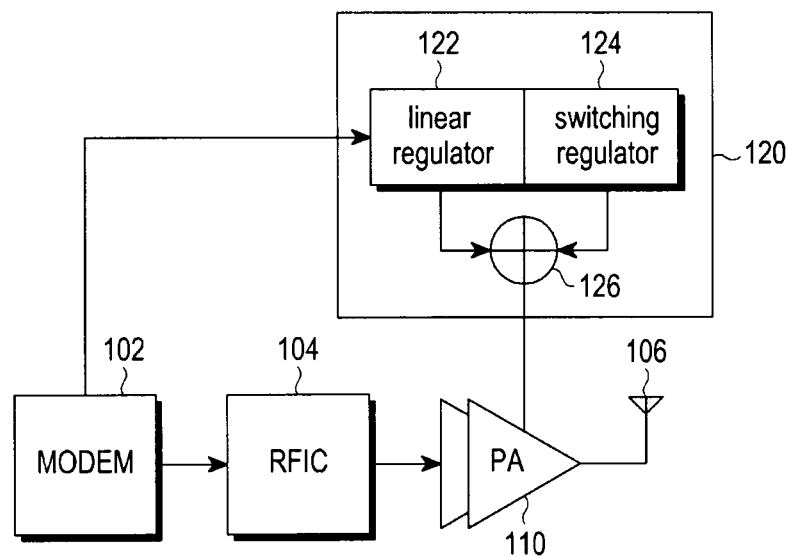
FIG. 1 is a diagram illustrating an inner structure of a transmitter including an ET RF PA, according to an embodiment of the present disclosure.

Embodiments are described in detail with reference to the accompanying drawings. The same or similar components may be designated by the same or similar reference numerals although they are illustrated in different drawings. Detailed descriptions of constructions processes known in the art may be omitted to avoid obscuring the subject matter of the present disclosure.

The terms and words used herein are not limited to meanings found in a standard dictionary, and are used to enable a clear and consistent understanding of the present disclosure.

It is to be understood that the singular forms "a," "an," and "the" also include plural referents unless the context clearly dictates otherwise. Thus, for example, reference to "a component surface" includes reference to one or more of such surfaces.

Although ordinal numbers such as "first," "second," and so forth are used to describe various components, those components are not limited by such ordinal numbers. The terms are only used to distinguish one component from another component. For example, a first component may be referred to as a second component, and likewise, a second component may be referred to as a first component, without departing from the teaching of the inventive concept. The term "and/or", as used herein, includes any and all combinations of one or more of the associated listed items.

It will be understood that the terms "comprises" and/or "has," when used herein, specify the presence of a stated feature, number, step, operation, component, element, or combination thereof, and do not preclude the presence or addition of one or more other features, numbers, steps, operations, components, elements, or combinations thereof.

According to an embodiment of the present disclosure, an electronic device may include communication functionality. For example, an electronic device may be embodied as a smart phone, a tablet personal computer (PC), a mobile phone, a video phone, an e-book reader, a desktop PC, a laptop PC, a netbook PC, a personal digital assistant (PDA), a portable multimedia player (PMP), an mp3 player, a mobile medical device, a camera, a wearable device (e.g., a head-mounted device (HMD), electronic clothes, electronic braces, an electronic necklace, an electronic appcessory, an electronic tattoo, or a smart watch), and/or the like.

According to an embodiment of the present disclosure, an electronic device may be embodied as a smart home appliance with communication functionality. A smart home appliance may be, for example, a television, a digital versatile disc (DVD) player, an audio player, a refrigerator, an air conditioner, a vacuum cleaner, an oven, a microwave oven, a washer, a dryer, an air purifier, a set-top box, a TV box, a gaming console, an electronic dictionary, an electronic key, a camcorder, an electronic picture frame, and/or the like.

According to an embodiment of the present disclosure, an electronic device may be embodied as a medical device (e.g., magnetic resonance angiography (MRA) device, a magnetic resonance imaging (MRI) device, computed tomography (CT) device, an imaging device, or an ultrasonic device), a navigation device, a global positioning system (GPS) receiver, an event data recorder (EDR), a flight data recorder (FDR), an automotive infotainment device, a naval electronic device (e.g., naval navigation device, gyroscope, or compass), an avionic electronic device, a security device, an industrial or consumer robot, and/or the like.

According to an embodiment of the present disclosure, an electronic device may be embodied as furniture, part of a building/structure, an electronic board, electronic signature receiving device, a projector, various measuring devices (e.g., water, electricity, gas or electro-magnetic wave measuring devices), and/or the like that include communication functionality.

According to an embodiment of the present disclosure, an electronic device may be any combination of the foregoing devices. In addition, it will be apparent to one having ordinary skill in the art that an electronic device is not limited to the foregoing devices.

A parallel output linear amplifier and operating method thereof, as described in embodiments of the present disclosure, may be applied to various communication systems such as, for example, a long term evolution (LTE) mobile communication system, an LTE-advanced (LTE-A) mobile communication system, a licensed-assisted access (LAA)-LTE mobile communication system, a high speed downlink packet access (HSDPA) mobile communication system, a high speed uplink packet access (HSUPA) mobile communication system, a high rate packet data (HRPD) mobile communication system proposed in a $3^{rd}$ generation partnership project 2 (3GPP2), a wideband code division multiple access (WCDMA) mobile communication system proposed in the 3GPP2, a code division multiple access (CDMA) mobile communication system proposed in the 3GPP2, an institute of electrical and electronics engineers (IEEE) 802.16ad communication system, an IEEE 802.16m communication system, an IEEE 802.16e communication system, an evolved packet system (EPS), a mobile internet protocol (Mobile IP) system, and/or the like.

An application, such as wireless mobile communication, in which battery power consumption is important requires a high effective RF/analog output amplifier for long battery use time.

There is a need for technology that remains highly effective at a high peak to average power ratio (PAPR).

Specially, a $4^{th}$ generation (4G) wireless communication channel requires a high linear characteristic and bandwidth for hardware of a terminal. Typical technology that decreases efficiency degradation due to a high PAPR is an ET PA. The ET PA changes a supply power for an RF PA according to an output power, thereby causing the RF PA to always operate at a saturation range. Specially, the ET PA makes the RF PA highly efficient for an input signal with a high PAPR.

FIG. 1 is a diagram illustrating an inner structure of a transmitter including an ET RF PA, according to an embodiment of the present disclosure.

Referring to FIG. 1, the transmitter includes a modulator/demodulator (MODEM) 102, an RF integrated circuit (RFIC) 104, an RF PA 110, an SM 120, and an antenna 106.

The MODEM 102 performs an encoding operation, a modulating operation, a baseband processing operation, and the like, and generates a signal including information to be transmitted, which is transferred to the RFIC 104. The MODEM 102 generates an envelope signal of the signal by applying an amplitude modulation (AM) scheme to the signal, and provides the envelope signal to the SM 120.

The RF IC 104 modulates the signal based on a carrier in a system band to generate an RF signal, and outputs the generated RF signal to the RF PA 110. The RF PA 110 amplifies the RF signal to a required power level to generate an amplified RF signal. The amplified RF signal is transmitted through the antenna 106.

The SM 120 receives the envelope signal, and outputs a signal, which is used as supply for the RF PA 110, to the RF PA 110. The SM 120 controls a fixed supply, which is provided from a battery, based on the envelope signal, resulting in optimal linearity and efficiency for the SM 120 and the RF PA 110.

In FIG. 1, the SM 120 includes a combination of a linear regulator 122 and a switching regulator 124. Outputs of the linear regulator 122 and the switching regulator 124 are combined in a combiner 126, and the combined outputs are provided to the RF PA 110 as power for the RF PA 110.

The linear regulator 122 guarantees high output accuracy for power of the RF PA 110 by tracing a high frequency range of an envelope signal. The high frequency range refers to a frequency range that is higher than a preset threshold frequency range, and may be different according to various requirements. The high frequency range may be different according to various requirements, and this may be apparent to the those skilled in the art. Theses various requirements need not to be limited to specific requirements such as efficiency, speed, bandwidth, dynamic range, a linear characteristic, load drive capacity, and the like. The switching regulator 124 traces a low frequency range of an envelope signal in order to provide a wide range of output voltage and output current. The low frequency range refers to a frequency range that is lower than the preset threshold frequency range, and may be different according to various requirements.

The linear regulator 122 includes an analog output amplifier, and the analog output amplifier has a high requirement for efficiency, speed, bandwidth, dynamic range, a linear characteristic, load drive capacity, and the like.

The analog output amplifier has a structure that provides a high output power in order to drive a load with a small value, and has been studied to have a high efficiency and increased speed and linearity. Generally, main design criteria for an output amplifier such as, for example, efficiency, bandwidth, linearity, load drive capacity, and the like are considered.

Figure 2A:
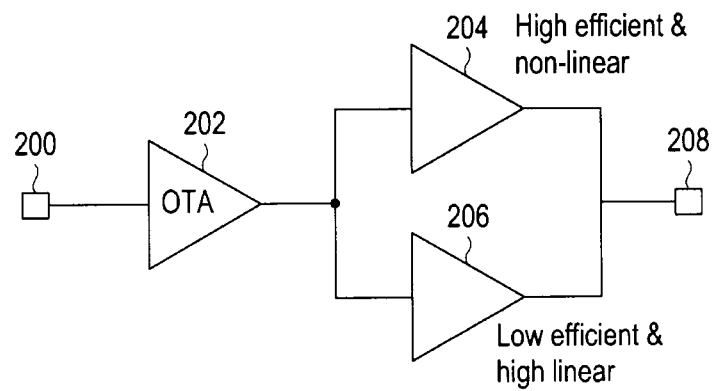
FIGS. 2A, 2B, and 2C are diagrams illustrating structures of an analog output amplifier included in an SM.

FIG. 2A is a diagram illustrating a structure of an analog output amplifier included in an SM.

Referring to FIG. 2A, an analog output amplifier includes a first stage amplifier 202 for inputting an envelope signal from an input terminal 200, and two second stage amplifiers 204 and 206, which are connected in parallel between the first stage amplifier 202 and an output terminal 208.

The first stage amplifier 202 includes an operational transconductance amplifier (OTA) for amplifying the envelope signal, which is input from the input terminal 200. A first second stage amplifier 204 is an output amplifier with high efficiency and non-linear output. A second stage amplifier 206 is an output amplifier with low efficiency and high linear output. It is possible to supplement the shortcomings of each second stage amplifier by combining output signals of the second stage amplifiers 204 and 206 at the output terminal 208. However, the second stage amplifiers 204 and 206 share the first stage amplifier 202 and are driven by the first stage amplifier 202, so it may be difficult to acquire an optimized design and improve performance.

Figure 2B:
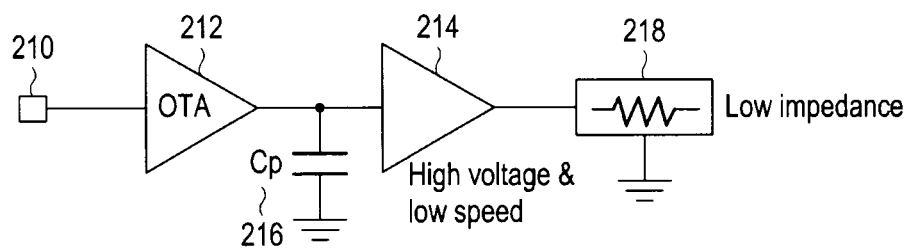

FIG. 2B is a diagram illustrating a structure of an analog out amplifier included in an SM.

Referring to FIG. 2B, an analog output amplifier includes a first stage amplifier 212 that receives an envelope signal, and a class AB or class B (class AB/B) output amplifier 214, which is connected to the first stage amplifier 212.

The first stage amplifier 212 includes an OTA for amplifying the envelope signal, which is input from the input terminal 210.

The structure of FIG. 2B results in a large parasitic capacitance 216, since the class AB/B output amplifier 214 has an adaptive efficiency and linear characteristic and needs to be configured with large sized high reliability device in order to drive a load 218 with a low equivalent impedance, high output voltage, and output current. The large parasitic capacitance 216 may decrease an operating speed and a bandwidth of the analog output amplifier.

Figure 2C:
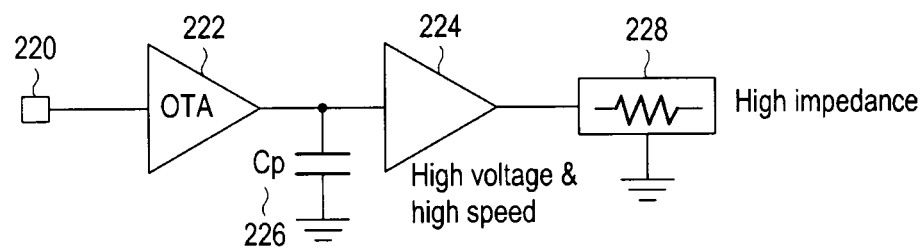

FIG. 2C is a diagram illustrating a structure of an analog out amplifier included in an SM.

Referring to FIG. 2C, an analog output amplifier includes a first stage amplifier 222 for receiving an envelope signal from an input terminal 220, and a class AB/B cascode amplifier 224, which is connected to the first stage amplifier 222.

The first stage amplifier 222 includes an OTA for amplifying the envelope signal, which is input from the input terminal 220.

The class AB/B cascode amplifier 224 has a second stage amplifier structure, which increases an operating speed by connecting a high speed device and a high reliability device with a cascode form instead of including a large sized high reliability device, thereby decreasing a parasitic capacitance 226. The maximum output voltage and maximum output drive current of the analog output amplifier of FIG. 2C are limited due to the cascode structure. Therefore, the analog output amplifier may not decrease equivalent impedance.

An embodiment of the present disclosure provides an analog output amplifier that is able to achieve high target values for efficiency, speed, bandwidth, dynamic range, linear characteristic, and load drive capacity under limited process performance. Specifically, an analog output amplifier, such as, for example a multi-mode, multi-band (MMMB) RF PA, may be configured to drive an output load that has a high efficiency, a high speed, a high linear characteristic, and a wide load range.

Figure 3A:
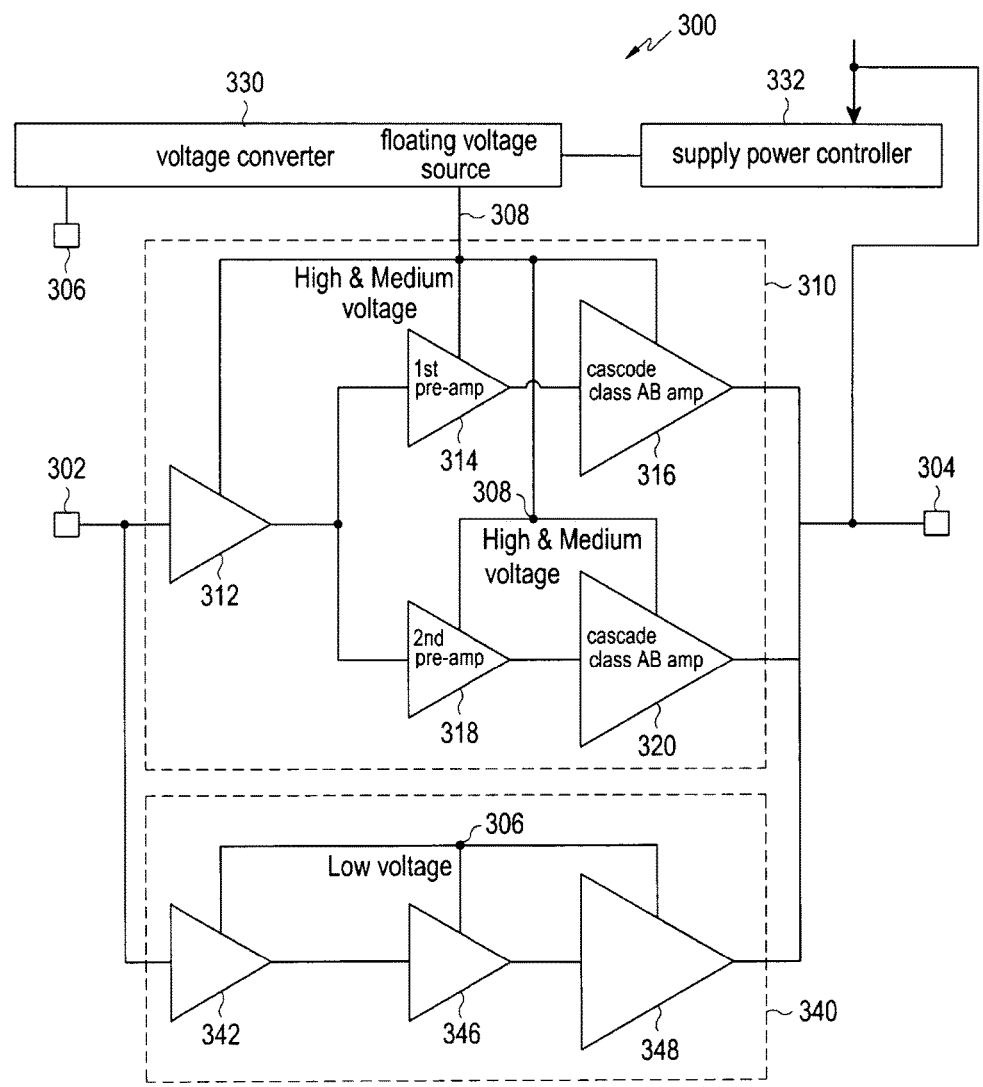
FIG. 3A is a diagram illustrating a structure of an analog output amplifier included in an SM, according to an embodiment of the present disclosure.

FIG. 3A is a diagram illustrating a structure of an analog output amplifier included in an SM, according to an embodiment of the present disclosure.

Referring to FIG. 3A, an analog output amplifier 300 includes a 3-stage parallel combined amplifier 310 for receiving an envelope signal from an input terminal 302 and providing the envelope signal to an output terminal 304 as supply power for an RF PA. The analog output amplifier 300 also includes a voltage converter 330 that provides a drive voltage 308 for the 3-stage parallel combined amplifier 310. The analog output amplifier 300 further includes a supply power controller 332 for controlling an operation of the voltage convertor 330.

Further, a third stage amplifier 340 may be connected to the 3-stage parallel combined amplifier 310 in parallel between the input terminal 302 and the output terminal 304. The third stage amplifier 340 is operated by supply power 306, which is lower than the drive voltage 308 of the 3-stage parallel combined amplifier 310, and which is provided by the voltage converter 330.

The voltage converter 330 is a direct current (DC)-DC converter that receives battery voltage as input and provides voltage for the 3-stage parallel combined amplifier 310 and the third stage amplifier 340 under a control of the supply power controller 332. The voltage converter 330 may include a buck boost convertor.

The supply voltage controller 332 determines an output voltage of the voltage convertor 330 according to a control signal from a MODEM so that the 3-stage parallel combined amplifier 310 and the third stage amplifier 340 have a large dynamic range.

The 3-stage parallel combined amplifier 310 includes 3 stages. A first stage amplifier 312 included in the 3-stage parallel combined amplifier 310 includes a transconductance amplifier 312, which is commonly used in a parallel combined output driver, and which is connected to two paths. A second stage included in the 3-stage parallel combined amplifier 310 includes pre-amplifiers 314 and 318, which are operated by a floating voltage source in order to drive third stage amplifiers 316 and 320 by providing an optimal operating bias to the third stage amplifiers 316 and 320 for each path. The third stage amplifiers 316 and 320 included in the 3-stage parallel combined amplifier 310 operate as output drivers, which are driven by the pre-amplifiers 314 and 318. A third stage amplifier 316 for the first path is configured with a high speed and high efficiency output driver, and a third stage amplifier 320 for the second path is configured with a large current drivable output driver.

The third stage amplifier 340, which is specific to the supply power 306, may consume low power and have a high speed and bandwidth by including short channel core devices without using an input/output device.

The voltage converter 330 includes a power supply and a floating voltage source. The power supply provides the power supply voltage 306, and the floating voltage source provides a floating drive voltage 308. The floating drive voltage 308 is connected to the power supply voltage inputs of the transconductance amplifier 312, the first pre-amplifier 314, the third stage cascode class AB amplifier 316, the second pre-amplifier 318, and the third stage cascade class AB amplifier 320. The power supply voltage 306 is connected to the power supply voltage inputs of the three amplifiers 342, 346, and 348 of the third stage amplifier 340. In addition, the output 304 of the analog output amplifier 300 is connected to the output of the 3-stage parallel combined amplifier 310, the output of the third stage amplifier 340, and the input of the supply power controller 332. The supply power controller 332 is connected to the voltage converter 330.

Figure 3B:
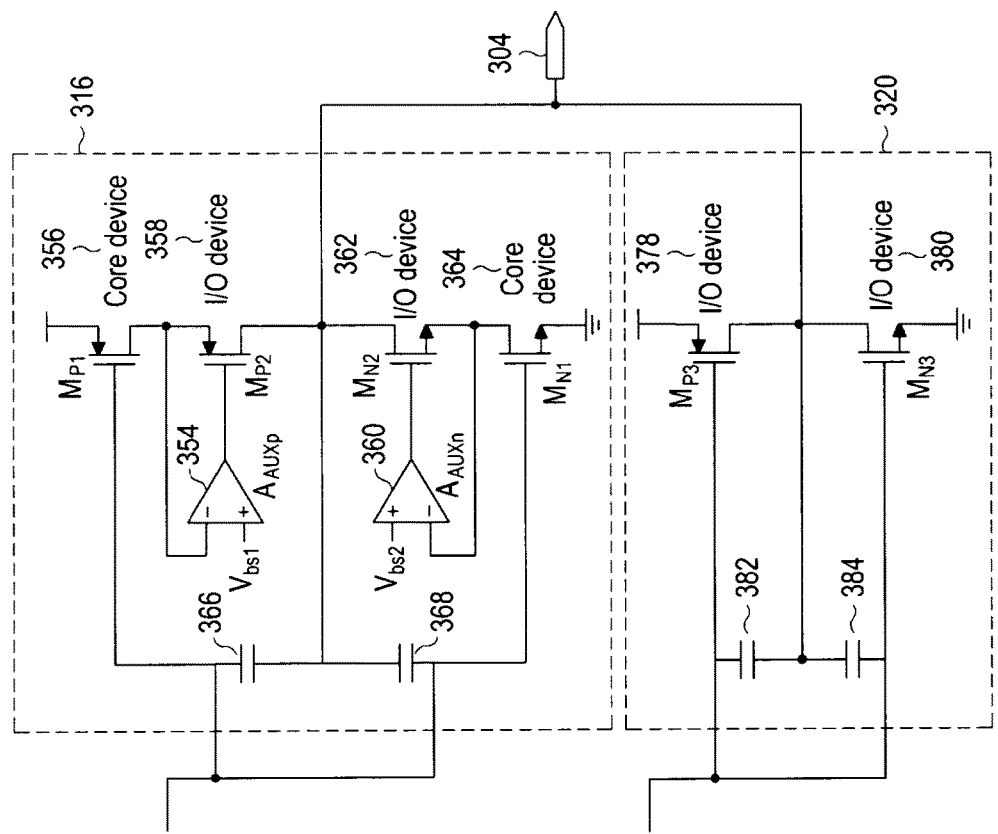
FIG. 3B is a diagram illustrating an example of a structure of a cascode class AB amplifier and a cascade class AB amplifier according to an embodiment of the present disclosure.

FIG. 3B is a diagram illustrating an example of a structure of a cascode class AB amplifier and a cascade class AB amplifier according to an embodiment of the present disclosure.

Referring to FIG. 3B, a core device 356 and the input/output device 358 are configured with a P-channel metal oxide semiconductor field effect transistor (MOSFET) MP1 and a P-channel MOSFET MP2, respectively. The core device 356 has a source (S) terminal, which is connected to drive voltage, and a gate (G) terminal, which is connected to an input. The input/output device 358 has a source terminal, which is connected to a drain (D) terminal of the core device 356, and a drain terminal, which is connected to an input through a capacitor 366.

A core device 364 and an input/output device 362 are configured with an N-channel MOSFET MN1 and an N-channel MOSFET MN2, respectively. The input/output device 362 has a drain terminal, which is connected to an input through the capacitor 368. The core device 364 has a drain terminal, which is connected to the source terminal of the input/output device 362, a gate terminal which is connected to an input, and a source terminal which is grounded. Drain terminals of the input/output devices 358 and 4362 are connected to an output terminal 304.

Further, an auxiliary amplifier $A_{AUXp}$ 354 is included in the third stage cascode class AB amplifier 316, and has a positive (+) input connected to a bias voltage Vbs1, a negative (−) input connected to the drain terminal of the core device 356 and the source terminal of the input/output terminal 358, and an output connected to the gate terminal of the input/output terminal 358. An auxiliary amplifier $A_{AUXn}$ 360 is included in the third stage cascode class AB amplifier 316, and has a positive (+) input connected to a bias voltage a Vbs2, negative (−) input connected to the drain terminal of the core device 364 and the source terminal of the input/output terminal 362, and an output connected to the gate terminal of the input/output terminal 362.

The third stage cascade class AB amplifier 320 is a class AB/B amplifier that includes input/output devices 378 and 380, which are connected in a cascade form. The input/output device 378 is configured with a P-channel MOSFET MP3, and the input/output device 380 is configured with an N-channel MOSFET MN3.

A source terminal of the input/output device 378 is connected to a drive voltage, and a drain terminal of the input/output device 378 is connected to an input through a capacitor 384. The drain terminals of the input/output devices 378 and 380 are connected to the output terminal 304.

The second stage amplifiers 406, 410, 432, and 436 perform a current amplifying operation. A pole, which is among the first stage amplifier 404 and the second stage amplifiers 406, 410, 432, and 436 on each path, is located at a frequency that is higher than a frequency of a second pole on a frequency axis among poles which occur in a circuit, and does not significantly affect GBW and stability of an entire circuit.

In order to have a wide GBW and acquire a phase margin, the third stage cascode class AB amplifier 316 and the third stage cascode class AB amplifier 320 need to have a large effective transconductance. In order to increase an effective transconductance of the third stage cascode class AB amplifier 316 and the third stage cascode class AB amplifier 320, channel width and channel length of the MOSFETs 356, 364, 378, and 380 need to increase or bias current must increase.

If the core devices 356 and 364, which are implemented with short channel devices, which may acquire a large effective transconductance using the same bias current, are used in order to configure the third stage cascode class AB amplifier 316 and the third stage cascode class AB amplifier 320, the third stage cascode class AB amplifier 316 and the third stage cascode class AB amplifier 320 may be configured with a high speed and high efficiency.

However, in an application that provides high output voltage, a reliability issue occurs due to a breakdown voltage of short channel high speed devices.

In order to prevent the breakdown voltage, the third stage cascode class AB amplifier 316 is configured with a class A/AB amplifier including device pairs 356 and 358, and 362 and 364, which are connected in a cascode form. This cascode structure may distribute voltage stress that is applied to the devices pairs 356 and 358, and 362 and 364. If high voltage devices are used for the cascode structure, voltage stress is decreased, and it is possible to solve a device reliability issue of an entire circuit.

Alternatively, when a cascode structure is configured using general short-channel devices, e.g., the core devices 356 and 364, if a final output voltage of an entire circuit swings within a large range (e.g., 0~VDD), voltage stress, which is applied to each of the general short-channel devices 356 and 364, is not constant, and the voltage stress may be greater than the breakdown voltage, which the general short-channel devices 356 and 364 guarantee. That is, if the output voltage is less than or equal to a specific value, gate bias versus source voltage of the input/output device 358 is tracked with a difference Vgs, so drain-source voltage Vds may be greater than breakdown voltage.

The auxiliary amplifiers 354 and 360 prevent the breakdown voltage problem, and are implemented between the gate terminal and the source terminal of the input/output devices 358 and 362 to form a local loop. The auxiliary amplifiers 354 and 360 make a drain-source voltage of the core devices 356 and 364, which are configured with short-channel devices, to always equal reference voltage Vbs1 and Vbs2 of the auxiliary amplifiers 354 and 360, thereby making the drain-source voltage constant regardless of swing of output voltage.

Figure 4:
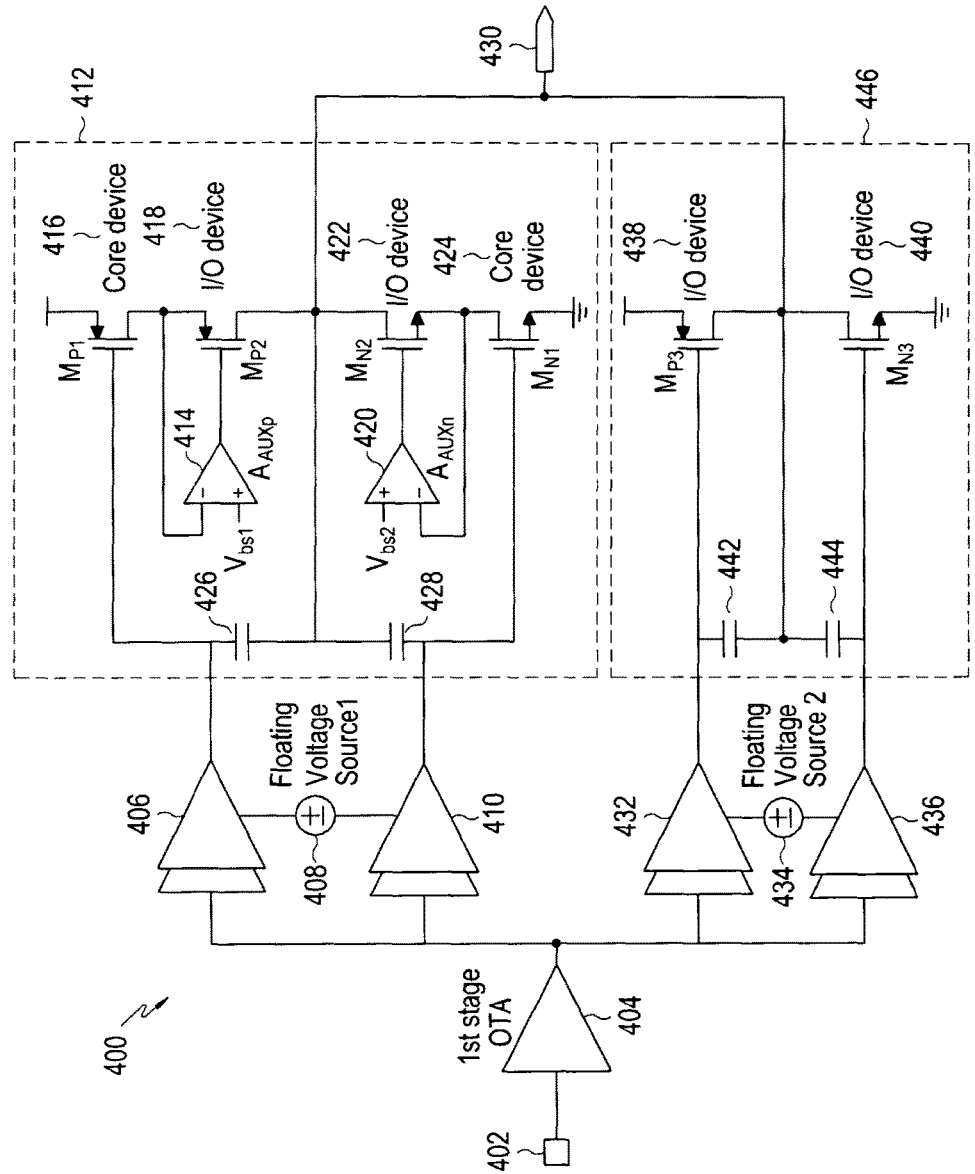
FIG. 4 is a diagram illustrating a circuit structure of an analog output amplifier, according to an embodiment of the present disclosure.

FIG. 4 is a diagram illustrating a circuit structure of an analog output amplifier, according to an embodiment of the present disclosure.

Referring to FIG. 4, a first stage amplifier 404 in an analog output amplifier 400 receives an envelope signal from an input terminal 402, and amplifies the input envelope signal. The first stage amplifier 404 transfers the amplified signal to second stage amplifiers 406, 410, 432, and 436 on two paths, which are connected to the first stage amplifier 404.

Second stage amplifiers 406 and 410 on the first path are operated by a first floating voltage source 408, and second stage amplifiers 432 and 436 on the second path are operated by a second floating voltage source 434.

The floating voltage sources 408 and 434 provide the drive voltage 308 from the voltage convertor 330 to the second stage amplifiers 406, 410, 432, and 436. Alternatively, the second stage amplifiers 406, 410, 432, and 436 may be provided with a drive voltage from a single floating voltage source.

The second stage amplifiers 406 and 410 on the first path are connected to a third stage amplifier 412. The second stage amplifier 406 is connected to a core device 416 and an input/output device 418 included in the third stage amplifier 412, which are connected with a cascode form. The second stage amplifier 410 is connected to an input/output device 422 and a core device 424 included in the third stage amplifier 412, which are connected with a cascode form.

The core device 416 and the input/output device 418 are configured with a P-channel metal oxide semiconductor field effect transistor (MOSFET) $M_{P1}$ and a P-channel MOSFET $M_{P2}$, respectively. The core device 416 has a source (S) terminal, which is connected to drive voltage, and a gate (G) terminal, which is connected to an output of the second stage amplifier 406. The input/output device 418 has a source terminal, which is connected to a drain (D) terminal of the core device 416, and a drain terminal, which is connected to an output of the second stage amplifier 410 through the output of the second stage amplifier 406 and a capacitor 428.

The core device 424 and the input/output device 422 are configured with an N-channel MOSFET $M_{N1}$ and an N-channel MOSFET $M_{N2}$, respectively. The input/output device 422 has a drain terminal, which is connected to the output of the second stage amplifier 410 through the output of the second stage amplifier 406 and the capacitor 428. The core device 424 has a drain terminal, which is connected to the source terminal of the input/output device 422, a gate terminal which is connected to the output of the second amplifier 410, and a source terminal which is grounded. Drain terminals of the input/output devices 418 and 422 are connected to an output terminal 430.

Further, an auxiliary amplifier $A_{AUXp}$ 414 is included in the third stage amplifier 412, and has a positive (+) input connected to a bias voltage $V_{bs1}$, a negative (−) input connected to the drain terminal of the core device 416 and the source terminal of the input/output terminal 418, and an output connected to the gate terminal of the input/output terminal 418. An auxiliary amplifier $A_{AUXn}$ 420 is included in the third stage amplifier 412, and has a positive (+) input connected to a bias voltage a $V_{bs2}$, negative (−) input connected to the drain terminal of the core device 424 and the source terminal of the input/output terminal 422, and an output connected to the gate terminal of the input/output terminal 422.

The second stage amplifiers 432 and 436 on the second path are connected to a third stage amplifier 446. The third stage amplifier 446 is a class AB/B amplifier that includes input/output devices 438 and 440, which are connected in a cascade form. The input/output device 438 is configured with a P-channel MOSFET $M_{P3}$, and the input/output device 440 is configured with an N-channel MOSFET $M_{N3}$.

Output of the second stage amplifier 432 is connected to a gate terminal of the input/output device 438. A source terminal of the input/output device 438 is connected to a drive voltage, and a drain terminal of the input/output device 438 is connected to an output of the second stage amplifier 436 through an output of the second stage amplifier 432 and a capacitor 444. The drain terminals of the input/output devices 438 and 440 are connected to an output terminal 430.

The second stage amplifiers 406, 410, 432, and 436 perform a current amplifying operation. A pole, which is among the first stage amplifier 404 and the second stage amplifiers 406, 410, 432, and 436 on each path, is located at a frequency that is higher than a frequency of a second pole on a frequency axis among poles which occur in a circuit, and does not significantly affect GBW and stability of an entire circuit.

The second stage amplifiers 406, 410, 432, and 436 cause the third stage amplifiers 412 and 446 on two paths to operate at an optimal bias point, and operate as pre-amplifiers that may drive parasitic input capacitances of the third stage amplifiers 412 and 446, which are driven by a large current. The second stage amplifiers 406, 410, 432, and 436, which are operated by the floating voltage sources 408 and 434, may provide a floating drive voltage for the third stage amplifiers 412 and 446.

The first stage amplifier 404 provides an amplified signal to the second stage amplifiers 406, 410, 432, and 436 resulting in a large effective transconductance $G_{m1}$ at the output terminals of the second stage amplifiers 406, 410, 432, and 436. Thus, unity gain bandwidth of the circuit and a speed of the entire circuit increase.

The third stage amplifiers 412 and 446, which generally operate as output drivers, frequently drive a load with a very low equivalent impedance (e.g., 1~50 ohm). Therefore, unless the effective transconductance $G_{m1}$ of the output terminals of the third stage amplifiers 412 and 446 is very large, it is difficult for the third stage amplifiers 412 and 446 to have a voltage gain that is greater than 1. Accordingly, a total open loop DC gain becomes very small, and it may be difficult to design a total loop characteristic. Thus, the second stage amplifiers 406, 410, 432, and 436 need to provide a gain that is enough to acquire a desired DC gain, e.g., a gain greater than 1.

The floating voltage sources 408 and 434 are located at each path, and the second stage amplifiers 406, 410, 432, and 436, which are operated by the floating voltage sources 408 and 434, may optimize a bias of each of the third stage amplifiers 412 and 446. That is, the floating voltage sources 408 and 434 trace a change of output voltage VDD and threshold voltage to causing the second stage amplifiers 406, 410, 432, and 436 to provide a bias, which is insensitive to a change of a process, voltage, and temperature (PVT), to the third stage amplifiers 412 and 446 on each path.

In order to have a wide GBW and acquire a phase margin, the third stage amplifiers 412 and 446 need to have a large effective transconductance. In order to increase an effective transconductance of the third stage amplifiers 412 and 446, channel width and channel length of the MOSFETs 416, 424, 438, and 440 must increase or bias current must increase.

However, increasing the channel width and the channel length result in an increased parasitic capacitance, and a decreased bandwidth and increased load of pre-amplifiers 406, 410, 432, and 436 may occur due to an increased capacitance of capacitors 426, 428, 442, and 444. Decreasing the bandwidth includes decreasing a frequency location of a dominant pole, which first occurs on a frequency axis. Further, increasing a bias current results in decreased efficiency.

If the core devices 416 and 424, which are implemented with short channel devices, which may acquire a large effective transconductance using the same bias current, are used in order to configure the third stage amplifiers 412 and 438, the third stage amplifiers 412 and 438 may be configured with a high speed and high efficiency.

However, in an application that provides high output voltage, a reliability issue occurs due to a breakdown voltage of short channel high speed devices.

In order to prevent the breakdown voltage, the third stage amplifier 412 is configured with a class A/AB amplifier including device pairs 416 and 418, and 422 and 424, which are connected in a cascode form. This cascode structure may distribute voltage stress that is applied to the devices pairs 416 and 418, and 422 and 424. If high voltage devices are used for the cascode structure, voltage stress is decreased, and it is possible to solve a device reliability issue of an entire circuit.

Alternatively, when a cascode structure is configured using general short-channel devices, e.g., the core devices 416 and 424, if a final output voltage of an entire circuit swings within a large range (e.g., 0~VDD), voltage stress, which is applied to each of the general short-channel devices 416 and 424, is not constant, and the voltage stress may be greater than the breakdown voltage, which the general short-channel devices 416 and 424 guarantee. That is, if the output voltage is less than or equal to a specific value, gate bias versus source voltage of the input/output device 418 is tracked with a difference $V_{gs}$, so drain-source voltage $V_{ds}$ may be greater than breakdown voltage.

The auxiliary amplifiers 414 and 420 prevent the breakdown voltage problem, and are implemented between the gate terminal and the source terminal of the input/output devices 418 and 422 to form a local loop. The auxiliary amplifiers 414 and 420 make a drain-source voltage of the core devices 416 and 424, which are configured with short-channel devices, to always equal reference voltage $V_{bs1}$ and $V_{bs2}$ of the auxiliary amplifiers 414 and 420, thereby making the drain-source voltage constant regardless of swing of output voltage.

Figure 5:
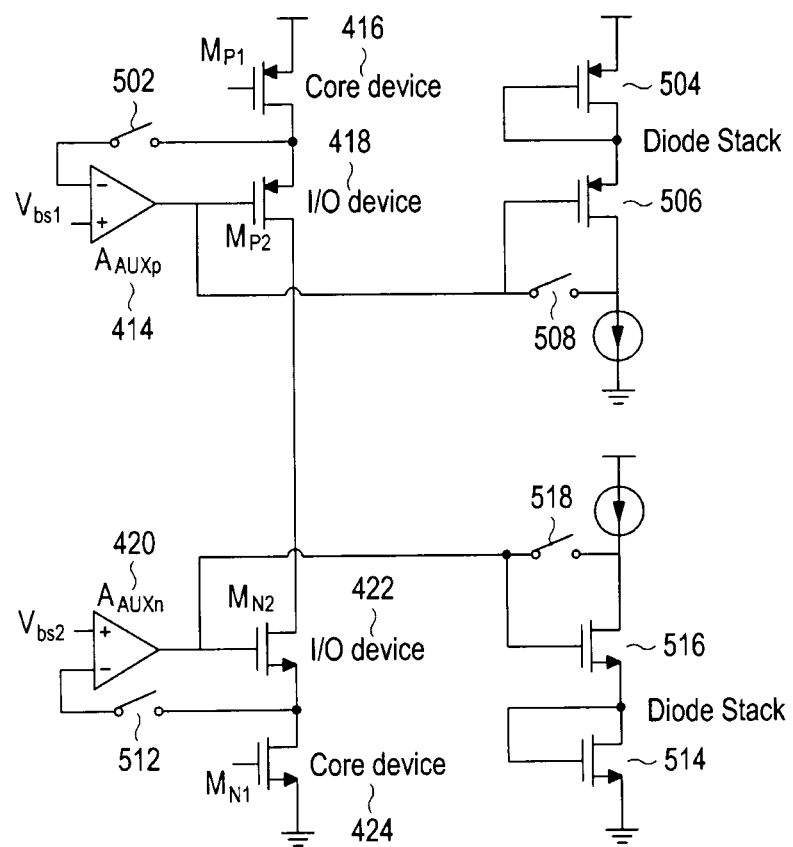
FIG. 5 is a diagram illustrating a circuit structure of a third stage amplifier included in an analog output amplifier, according to an embodiment of the present disclosure.

FIG. 5 is a diagram illustrating a circuit structure of a third stage amplifier included in an analog output amplifier, according to an embodiment of the present disclosure.

Referring to FIG. 5, decreased efficiency may be reduced by connecting a diode stack including P-channel MOSFETs 504 and 506, which are connected with a cascode structure, to a gate terminal of the input/output device 418 instead of the auxiliary amplifier 414.

A switch 502, which is connected between a negative (−) input of the auxiliary amplifier 414 and a source terminal of the input/output device 418, is closed when the auxiliary amplifier 414 is selected to be used. The switch 502 is open when the diode stacks 504 and 506 are selected to be used.

A switch 508, which is connected between a gate terminal and a drain terminal of the P-channel MOSFET 506, is open when the auxiliary amplifier 414 is selected to be used. The switch 508 is closed when the diode stacks 504 and 506 are selected to be used.

A local loop, which uses the auxiliary amplifier 414, fixes a source voltage of the devices 416 and 418, which are connected with a cascode form.

The diode stacks 504 and 506 fix a gate voltage of the input/output device 418. Thus, a gate-source voltage of the input/output device 418 may be automatically adjusted according to an output signal level. The $V_{ds}$ of the core device 416 is adjusted according to the automatically adjusted gate-source voltage, thus, the $V_{ds}$ of the core device 416 is not greater than the breakdown voltage.

Similarly, a diode stack including the P-channel MOSFETs 514 and 516, which are connected with a cascode form, may be connected to the gate terminal of the input/output device 422 instead of the auxiliary amplifier 420.

A switch 512, which is connected between a negative (−) input of the auxiliary amplifier 420 and a source terminal of the input/output device 422, is closed when the auxiliary amplifier 420 is selected to be used. The switch 512 is open when the diode stacks 514 and 516 are selected to be used.

A switch 518, which is connected between a gate terminal and a drain terminal of the P-channel MOSFET 516, is open when the auxiliary amplifier 420 is selected to be used. The switch 518 is closed when the diode stacks 514 and 516 are selected to be used.

Figure 6:
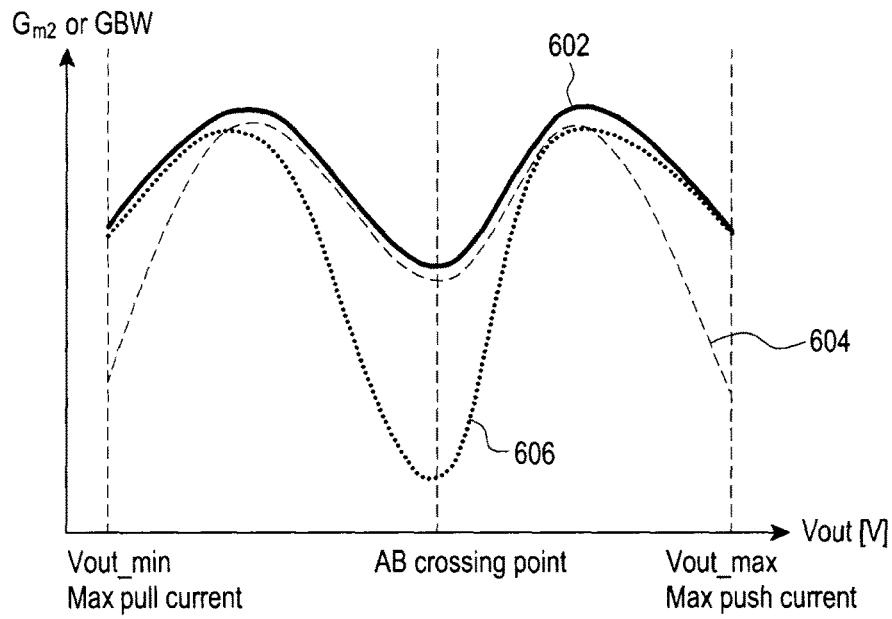
FIG. 6 is a graph illustrating a characteristic of an effective transconductance and a gain bandwidth (GBW) of a parallel combined amplifier, according to an embodiment of the present disclosure.

FIG. 6 is a graph showing a characteristic of an effective transconductance and a GBW of a parallel combined amplifier, according to an embodiment of the present disclosure.

Referring to FIG. 6, a curve 602 indicates an effective transconductance versus output voltage of a parallel combined amplifier, according to an embodiment of the present disclosure. Curve 604 indicates an effective transconductance versus output voltage of a class AB amplifier with a cascode structure. A curve 606 indicates an effective transconductance versus output voltage of a typical class AB/B amplifier 446.

As shown in the graph of FIG. 6, amplifiers operating as a push/pull output driver have the smallest bias current at an AB crossing point, and the smallest effective transconductance $G_{m2}$. As $G_{m2}$ decreases, a GBW also decreases.

As shown in the curve 606, a general class AB/B amplifier has an effective transconductance according to a push/pull current. As shown in the curve 604, a class AB amplifier with a cascode structure uses high speed devices, so the class AB amplifier has a $G_{m2}$ and GBW that are higher than the general class AB/B amplifier at the same bias current.

However, the class AB amplifier with the cascode structure may not acquire a sufficient drain-source voltage $V_{ds}$ at a maximum/minimum (Max/Min) output voltage as a maximum push/pull current range, and thus, $G_{m2}$ and GBW rapidly decrease. The general class AB/B amplifier may provide a sufficient push/pull current using high voltage devices and may acquire a sufficient drain-source voltage, and thus, $G_{m2}$ and GBW do not rapidly decrease at the maximum push/pull current range.

A parallel combined amplifier, according to an embodiment of the present disclosure, may have good $G_{m2}$ and GBW within an entire range of an output voltage, as shown in the curve 602 by combining output of two amplifiers. Parallel output on two paths may be optimized and combined through an independent pre-buffer.

Figure 7:
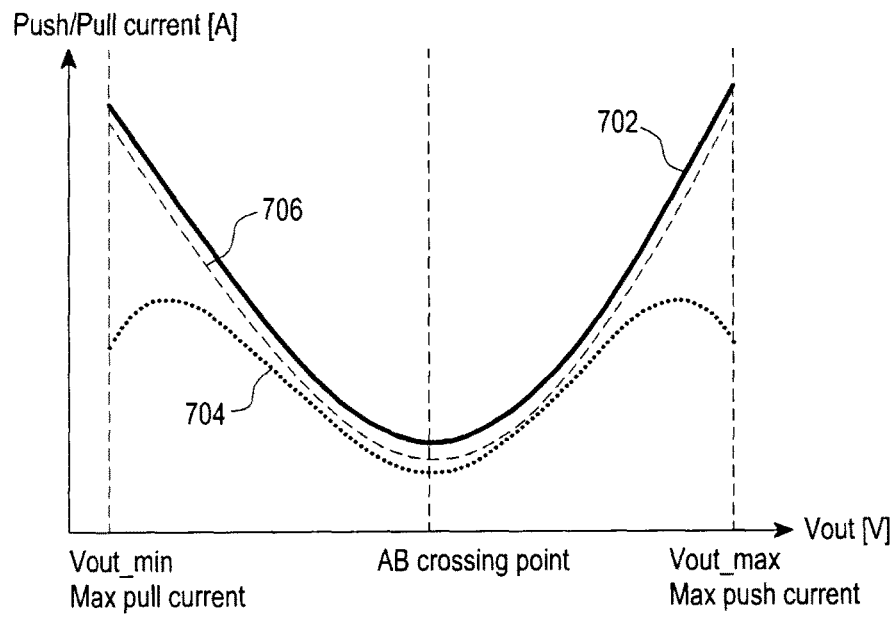
FIG. 7 is a graph illustrating a characteristic of a push/pull current operation of a parallel combined amplifier, according to an embodiment of the present disclosure.

FIG. 7 is a graph showing a characteristic of a push/pull current operation of a parallel combined amplifier, according to an embodiment of the present disclosure.

Referring to FIG. 7, a curve 702 indicates output voltage versus push/pull current of a parallel combined amplifier, according to an embodiment of the present disclosure. A curve 704 indicates output voltage versus push/pull current of a class AB amplifier with a cascode structure. A curve 706 indicates output voltage versus push/pull current of a general class AB/B amplifier.

As shown in the curve 702, the parallel combined amplifier may provide a sufficiently high output current through a parallel structure according to a range of a push/pull current. That is, as shown in the curve 704, the class AB amplifier with the cascode structure has a limited maximum output current according to a margin of drain-source voltage of a short-channel device. Specifically, if an equivalent impedance value of a load that exists at an output terminal is small, it is impossible to provide a sufficiently high drive current.

Figure 8:
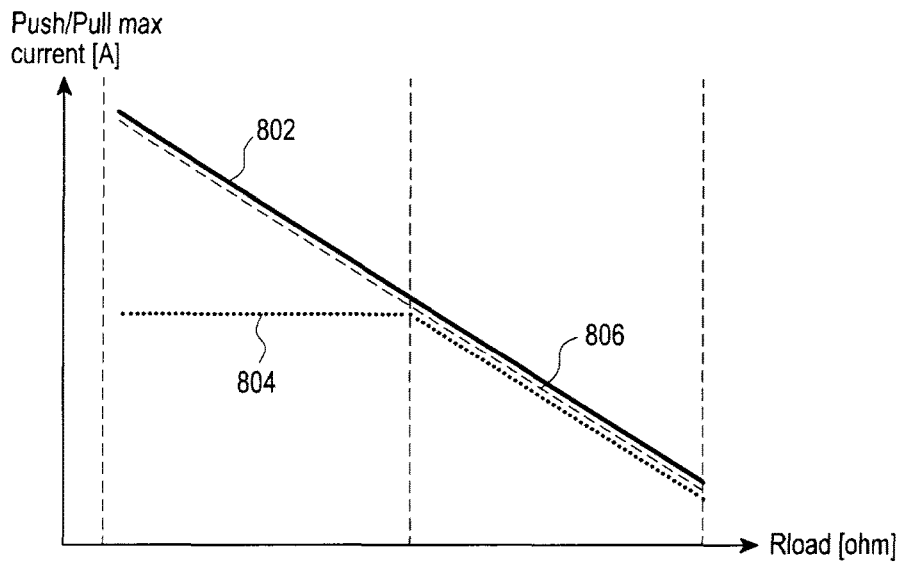
FIG. 8 is a graph illustrating a load drive capability of a parallel combined amplifier, according to an embodiment of the present disclosure.

FIG. 8 is a graph showing a load drive capability of a parallel combined amplifier, according to an embodiment of the present disclosure.

Referring to FIG. 8, a line 802 indicates load resistance versus push/pull current of a parallel combined amplifier, according to an embodiment of the present disclosure. Lines 804 indicate a load resistance versus push/pull current of a class AB amplifier with a cascode structure. A line 806 indicates output voltage versus push/pull current of a general class AB/B amplifier.

As shown in the lines 804, the class AB amplifier with the cascode structure may not push or pull a sufficient current if equivalent resistance of a load is low.

As shown in the line 806, the general class AB/B amplifier has low GBW, and has a sufficient load drive capacity regardless of equivalent resistance of a load.

Accordingly, as shown in the line 802, the parallel combined amplifier may have a sufficient load drive capacity at a wide load range by combining the output of two amplifiers.

An embodiment of the present disclosure may widen a dynamic range of an amplifier and increase efficiency at a back-off power range by adjusting a supply voltage of an amplifier according to a peak level of an output signal to increase efficiency at a low output level. That is, an embodiment of the present disclosure may widen a minimum output range of the amplifier and increase efficiency at a minimum output power by providing a low voltage output.

Figure 9:
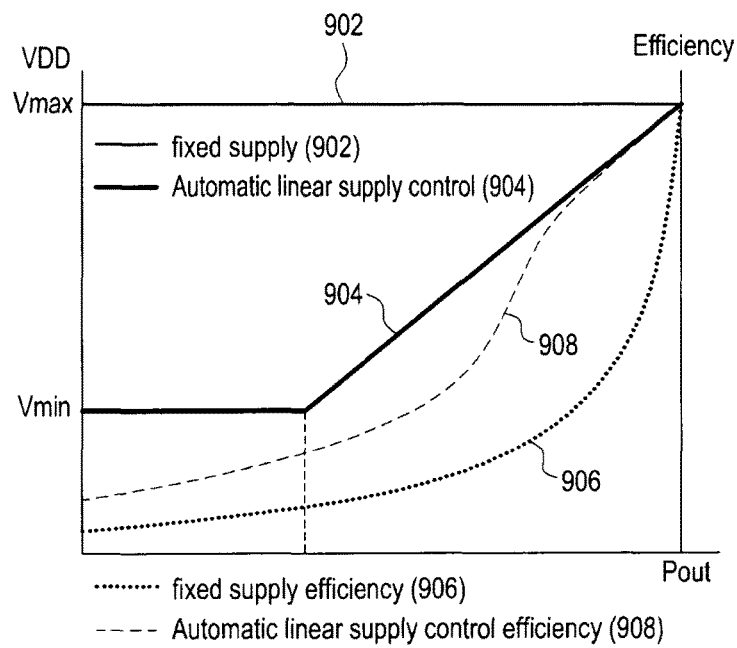
FIG. 9 is a graph illustrating a supply voltage according to output power, according to an embodiment of the present disclosure.

FIG. 9 is a graph showing supply voltage according to output power, according to an embodiment of the present disclosure.

Referring to FIG. 9, a line 902 indicates a fixed supply voltage, i.e., battery voltage, and a lines 904 indicate a supply voltage that is automatically adjusted according to automatic voltage control and has a range from a minimum voltage Vmin and maximum voltage Vmax. When the supply voltage is fixed, as shown in the line 902, efficiency according to an output power is shown in a curve 906. When the supply voltage is controlled as shown in the lines 904, and the low voltage-third stage amplifier 340 of FIG. 3A is used, efficiency according to an output power is shown in a curve 908. Thus, the curve 908 shows an improvement of efficiency according to output power compared to the curve 906.

The low voltage-third stage amplifier 340 of FIG. 3A may be implemented with short channel core devices instead of input/output devices, and may be operated by the voltage 306, which is lower than the minimum supply voltage Vmin of the 3-stage parallel combined amplifier 310. The voltage 306 is provided from the voltage convertor 330. As shown in FIG. 9, a back-off efficiency of an entire circuit may be increased using the low voltage-third stage amplifier 340.

A parallel combined amplifier, according to an embodiment of the present disclosure, may provide an optimal solution to an application of an SM for an ETPA.

Further, a parallel combined amplifier, according to an embodiment of the present disclosure, may drive various loads such as, for example, an MMMB RF PA, and may drive a large amount of power for an ET with high speed and high efficiency.

Certain aspects of the present disclosure may also be embodied as computer readable code on a non-transitory computer readable recording medium. A non-transitory computer readable recording medium is any data storage device that can store data, which can be thereafter read by a computer system. Examples of the non-transitory computer readable recording medium include read only memory (ROM), random access memory (RAM), CD-ROMs, magnetic tapes, floppy disks, optical data storage devices, and carrier waves (such as data transmission through the Internet). The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

It can be appreciated that a method and apparatus, according to an embodiment of the present disclosure, may be implemented by hardware, software, and/or a combination thereof. The software may be stored in a non-volatile storage, for example, an erasable or re-writable ROM, a memory, for example, a RAM, a memory chip, a memory device, or a memory integrated circuit (IC), or an optically or magnetically recordable non-transitory machine-readable (e.g., computer-readable), storage medium (e.g., a compact disk (CD), a DVD, a magnetic disk, a magnetic tape, and/or the like). A method and apparatus, according to an embodiment of the present disclosure, may be implemented by a computer or a mobile terminal that includes a controller and a memory, and the memory may be an example of a non-transitory machine-readable (e.g., computer-readable), storage medium suitable to store a program or programs including instructions for implementing various embodiments of the present disclosure.

The present disclosure may include a program including code for implementing the apparatus and method, and a non-transitory machine-readable (e.g., computer-readable), storage medium storing the program. The program may be electronically transferred via any media, such as communication signals, which are transmitted through wired and/or wireless connections.

An apparatus, according to an embodiment of the present disclosure, may receive the program from a program providing device which is connected to the apparatus, wirelessly or via a wire, and store the program. The program providing device may include a memory for storing instructions which instruct to perform a content protect method that has already been installed, information necessary for the content protect method, and the like, a communication unit for performing a wired or a wireless communication with a graphic processing device, and a controller for transmitting a related program to a transmitting/receiving device based on a request of the graphic processing device or automatically transmitting the related program to the transmitting/receiving device.

While the present disclosure has been shown and described with reference to certain embodiments thereof, it will be understood by those skilled in the art that various changes in form and detail may be made therein without departing from the spirit and scope of the present disclosure as defined by the appended claims and their equivalents.

What is claimed is:

1. A parallel output linear amplifier, comprising:
   a transconductance amplifier configured to receive an analog input signal from an input terminal and amplify the analog input signal;
   a first pre-amplifier connected to the transconductance amplifier and configured to operate using a floating drive voltage;
   a cascode class AB amplifier connected to the first pre-amplifier and configured to provide an amplified signal to an output terminal;
   a second pre-amplifier connected to the transconductance amplifier and configured to operate using the floating drive voltage; and
   a cascade class AB amplifier connected to the second pre-amplifier and configured to provide an amplified signal to the output terminal.

2. The parallel output linear amplifier of claim 1, wherein each of the first pre-amplifier and the second pre-amplifier comprises:
   a floating voltage source configured to trace an output voltage at the output terminal and provide the floating drive voltage;
   a first current amplifier connected to the transconductance amplifier and configured to operate using the floating voltage source; and
   a second current amplifier connected to the transconductance amplifier and configured to operate using the floating voltage source.

3. The parallel output linear amplifier of claim 1, wherein the floating drive voltage is controlled according to a change of an output voltage at the output terminal.

4. The parallel output linear amplifier of claim 1, wherein the cascode class AB amplifier comprises:
   a first cascode array including a first core device and a first input/output device that are connected in a cascode form;
   a first auxiliary amplifier that is connected between a source terminal and a gate terminal of the first input/output device in the first cascode array;
   a second cascode array including a second core device and a second input/output device that are connected in a cascode form, the second cascode array being symmetrically connected to the first cascode array; and
   a second auxiliary amplifier that is connected between a source terminal and a gate terminal of the second input/output device in the second cascode array.

5. The parallel output linear amplifier of claim 4, wherein each of the first auxiliary amplifier and the second auxiliary amplifier maintains a drain-source voltage of a core device, which is connected to a respective input/output device, to be equal to a reference voltage.

6. The parallel output linear amplifier of claim 1, wherein the cascode class AB amplifier comprises:
   a first cascode array including a first core device and a first input/output device that are connected in a cascode form;
   a first auxiliary amplifier connectable between a source terminal and a gate terminal of the first input/output device in the first cascode array;
   a first diode stack connectable to the source terminal of the first input/output device in the first cascode array;
   a first switch unit configured to connect one of the first auxiliary amplifier and the first diode stack to the first input/output device in the first cascode array;
   a second cascode array including a second core device and a second input/output device that are connected in a cascode form, the second cascode array being symmetrically connected to the first cascode array;
   a second auxiliary amplifier connectable between a source terminal and a gate terminal of the second input/output device in the second cascode array;
   a second diode stack connectable to the source terminal of the second input/output device in the second cascode array; and a second switch unit configured to connect one of the second auxiliary amplifier and the second diode stack to the second input/output device in the second cascode array.

7. The parallel output linear amplifier of claim 1, wherein the cascade class AB amplifier:
   includes two input/output devices connected in a cascade form; or
   is set to have a transconductance and an output current that are higher than a transconductance and an output current of the cascode class AB amplifier at a crossing point of an output voltage of the output terminal; or
   is set to have a transconductance and an output current that are higher than a transconductance and an output current of the cascode class AB amplifier at a maximum value and a minimum value of an output voltage at the output terminal.

8. The parallel output linear amplifier of claim 1, further comprising:
   a 3-stage amplifier configured to operate with a supply voltage that is lower than a minimum supply voltage value provided to the cascode class AB amplifier and the cascade AB class amplifier,
   wherein the third stage amplifier is connected between the input terminal and the output terminal.

9. An operating method of a parallel output linear amplifier, comprising:
   receiving, by a transconductance amplifier, an analog input signal from an input terminal;
   amplifying, by the transconductance amplifier, the analog input signal to generate a first amplified signal;
   generating, by a first pre-amplifier, a second amplified signal by amplifying the first amplified signal based on floating drive voltage;
   providing, by a cascode class AB amplifier, the second amplified signal to an output terminal;
   generating, by a second pre-amplifier, a third amplified signal by amplifying the first amplified signal based on the floating drive voltage; and
   providing, by a cascade class AB amplifier, the third amplified signal to the output terminal.

10. The operating method of claim 9, wherein each of the first pre-amplifier and the second pre-amplifier comprises:
    a floating voltage source configured to trace an output voltage at the output terminal and provide the floating drive voltage;
    a first current amplifier connected to the transconductance amplifier and configured to operate using the floating voltage source; and
    a second current amplifier connected to the transconductance amplifier and configured to operate using the floating voltage source.

11. The operating method of claim 9, wherein the floating drive voltage is controlled according to a change of an output voltage at the output terminal.

12. The operating method of claim 9, wherein the cascode class AB amplifier comprises:
    a first cascode array including a first core device and a first input/output device that are connected in a cascode form;
    a first auxiliary amplifier that is connected between a source terminal and a gate terminal of the first input/output device in the first cascode array;
    a second cascode array including a second core device and a second input/output device that are connected in a cascode form, the second cascode array being symmetrically connected to the first cascode array; and
    a second auxiliary amplifier that is connected between a source terminal and a gate terminal of the second input/output device in the second cascode array.

13. The operating method of claim 12, wherein each of the first auxiliary amplifier and the second auxiliary amplifiers maintains a drain-source voltage of a core device, which is connected to a respective input/output device, to be equal to a reference voltage.

14. The operating method of claim 9, wherein the cascode class AB amplifier comprises:
    a first cascode array including a first core device and a first input/output device that are connected in a cascode form;
    a first auxiliary amplifier connectable between a source terminal and a gate terminal of the first input/output device in the first cascode array;
    a first diode stack connectable to the source terminal of the first input/output device in the first cascode array;
    a first switch unit configured to connect one of the first auxiliary amplifier and the first diode stack to the first input/output device in the first cascode array;
    a second cascode array including a second core device and a second input/output device that are connected in a cascode form, the second cascode array being symmetrically connected to the first cascode array;
    a second auxiliary amplifier connectable between a source terminal and a gate terminal of the second input/output device in the second cascode array;
    a second diode stack connectable to the source terminal of the second input/output device in the second cascode array; and
    a second switch unit configured to connect one of the second auxiliary amplifier and the second diode stack to the second input/output device in the second cascode array.

15. The operating method of claim 9, wherein the cascade class AB amplifier:
    includes two input/output devices connected in a cascade form; or
    is set to have a transconductance and an output current that are higher than a transconductance and an output current of the cascode class AB amplifier at a crossing point of an output voltage of the output terminal, or
    is set to have a transconductance and an output current that are higher than a transconductance and an output current of the cascode class AB amplifier at a maximum value and a minimum value of an output voltage at the output terminal.

16. A parallel output linear amplifier, comprising:
    a first amplifier configured to receive an analog signal from an input terminal, amplify an analog input signal, and generate a first amplified signal;
    a second amplifier configured to receive the first amplified signal from the first amplifier, amplify the first amplified signal, and generate a second amplified signal;
    a third amplifier configured to receive the first amplified signal from the first amplifier, amplify the first amplified signal, and generate a third amplified signal;
    a fourth amplifier configured to receive the second amplified signal from the second amplifier, and provide the second amplified signal to an output terminal, the fourth amplifier being a cascode class AB amplifier; and
    a fifth amplifier configured to receive the third amplified signal from the third amplifier, and provide the third amplified signal to the output terminal, the fifth amplifier being a cascade class AB amplifier.

17. The parallel output linear amplifier of claim 16, wherein each of the second amplifier and the third amplifier comprises:
- a voltage source configured to provide a drive voltage;
- a first current amplifier connected to the first amplifier and configured to operate with the drive voltage from the voltage source; and
- a second current amplifier connected to the first amplifier and configured to operate with the drive voltage from the voltage source.

18. The parallel output linear amplifier of claim 16, wherein the fourth amplifier comprises:
- a first cascode array including a first core device and a first input/output device that are connected with in a cascode form;
- a first auxiliary amplifier that is connected between a source terminal and a gate terminal of the first input/output device in the first cascode array;
- a second cascode array including a second core device and an a second input/output device that are connected in a cascode form, the second cascode array being symmetrically connected to the first cascode array; and
- a second auxiliary amplifier that is connected between a source terminal and a gate terminal of the second input/output device in the second cascode array.

19. The parallel output linear amplifier of claim 16, wherein the fourth amplifier comprises:
- a first cascode array including a first core device and a first input/output device that are connected in a cascode form;
- a first auxiliary amplifier connectable between a source terminal and a gate terminal of the first input/output device in the first cascode array;
- a first diode stack connectable to the source terminal of the first input/output device in the first cascode array;
- a first switch unit configured to connect one of the first auxiliary amplifier and the first diode stack to the first input/output device in the first cascode array;
- a second cascode array including a second core device and an a second input/output device that are connected with in a cascode form, the second cascode array being symmetrically connected to the first cascode array;
- a second auxiliary amplifier connectable between a source terminal and a gate terminal of the second input/output device in the second cascode array;
- a second diode stack connectable to the source terminal of the second input/output device in the second cascode array; and
- a second switch unit configured to connect one of the second auxiliary amplifier and the second diode stack to the second input/output device in the second cascode array.

20. The parallel output linear amplifier of claim 16, wherein the fifth amplifier:
- includes two input/output devices connected in a cascode form, form; or
- is set to have a transconductance and an output current that are higher than a transconductance and an output current of the fourth amplifier at a crossing point of an output voltage of the output terminal; or
- is set to have a transconductance and an output current that are higher than a transconductance and an output current of the fourth amplifier at a maximum value and a minimum value of an output voltage at the output terminal.

21. The parallel output linear amplifier of claim 1, wherein each of the first pre-amplifier and the second pre-amplifier comprises a floating voltage source configured to trace an output voltage at the output terminal and provide the floating drive voltage.

22. The operating method of claim 9, wherein each of the first pre-amplifier and the second pre-amplifier comprises a floating voltage source configured to trace an output voltage at the output terminal and provide the floating drive voltage.

23. The parallel output linear amplifier of claim 16, wherein each of the second amplifier and the third amplifier comprises a floating voltage source configured to trace an output voltage at the output terminal and provide the floating drive voltage.

* * * * *